US006939579B2

(12) United States Patent
Bondestam et al.

(10) Patent No.: US 6,939,579 B2
(45) Date of Patent: Sep. 6, 2005

(54) ALD REACTOR AND METHOD WITH CONTROLLED WALL TEMPERATURE

(75) Inventors: Niklas Bondestam, Helsinki (FI); Sven Lindfors, Espoo (FI)

(73) Assignee: ASM International N.V., Bilthoven (NL)

(*) Notice: Subject to any disclaimer, the term of this patent is extended or adjusted under 35 U.S.C. 154(b) by 0 days.

(21) Appl. No.: 09/801,542

(22) Filed: Mar. 7, 2001

(65) Prior Publication Data

US 2002/0157611 A1 Oct. 31, 2002

(51) Int. Cl.⁷ ............... C23C 16/455; C23C 16/46; C30B 25/10
(52) U.S. Cl. ............... 427/255.7; 427/248.1; 118/724; 118/725; 117/84; 117/105
(58) Field of Search ............... 117/200, 201, 117/84, 85, 88, 105; 427/237, 248.1, 255.23, 255.28, 255.7, 587, 244.1; 118/715, 719, 724, 725, 728

(56) References Cited

U.S. PATENT DOCUMENTS

| | | | |
|---|---|---|---|
| 4,058,430 A | 11/1977 | Suntola et al. | 156/611 |
| 4,222,576 A | 9/1980 | Clements | |
| 4,389,973 A | 6/1983 | Suntola et al. | 118/725 |
| 4,413,022 A | 11/1983 | Suntola et al. | 427/255.2 |

(Continued)

FOREIGN PATENT DOCUMENTS

| | | |
|---|---|---|
| EP | 1 069 599 A2 | 1/2001 |
| WO | WO 96/17107 | 6/1996 |
| WO | WO 00/40772 | 7/2000 |
| WO | WO 00/47404 | 8/2000 |

OTHER PUBLICATIONS

B. Abeles et al.,"Amorphous Semiconductor Superlattices," *Physical Review Letters*, Vol. 51, No. 21, pp. 2003–2006 (Nov. 1983).

C. Düscö et al., "Deposition of Tin Oxide into Porous Silicon by Atomic Layer Epitaxy," *J. Electrochem. Soc.*, vol. 143, No. 2, pp. 683–687 (Feb. 1996).

L. Hiltunen et al., "Nitrides of Titanium, Niobium, Tantalum and Molybdenum Grown as Thin Films by the Atomic Layer Epitaxy Method," *Thin Solid Films*, vol. 166, pp. 149–154 (1988).

(Continued)

*Primary Examiner*—Timothy Meeks
*Assistant Examiner*—Wesley D. Markham
(74) *Attorney, Agent, or Firm*—Knobbe, Martens, Olson & Bear, LLP.

(57) ABSTRACT

The present invention relates to improved methods and apparatus for atomic layer deposition (ALD) of thin films on substrates such as wafers and flat panel displays. The invention provides an ALD reactor comprising a first temperature regulating system to control the temperature of the substrate and a second temperature regulating system to independently control the temperature of the reaction chamber walls. The invention also provides a method for ALD of a film onto a substrate in a reaction chamber, in which the temperature of the substrate is maintained to maximize ALD on the substrate while the temperature of the reaction chamber walls is set to minimize film growth thereon, whether by ALD, condensation, physisorption or thermal decomposition. The temperature of the walls may be maintained at the same temperature as the substrate, or higher or lower than the substrate temperature, depending upon the particular reaction being used.

20 Claims, 8 Drawing Sheets

U.S. PATENT DOCUMENTS

| | | | |
|---|---|---|---|
| 4,747,367 A | 5/1988 | Posa | 118/715 |
| 4,761,269 A | 8/1988 | Conger et al. | 422/245 |
| 4,836,138 A | 6/1989 | Robinson et al. | 118/666 |
| 4,889,319 A | 12/1989 | Phillips et al. | |
| 4,897,709 A * | 1/1990 | Yokoyama et al. | 257/301 |
| 4,993,357 A | 2/1991 | Scholz | 118/715 |
| 5,071,670 A | 12/1991 | Kelly | 427/38 |
| 5,281,274 A | 1/1994 | Yoder | 118/697 |
| 5,294,572 A | 3/1994 | Granneman et al. | 437/225 |
| 5,306,666 A | 4/1994 | Izumi | 437/192 |
| 5,314,574 A | 5/1994 | Takahashi | |
| 5,348,587 A * | 9/1994 | Eichman et al. | 118/723 MP |
| 5,520,743 A | 5/1996 | Takahashi | |
| 5,709,757 A | 1/1998 | Hatano et al. | |
| 5,711,811 A | 1/1998 | Suntola et al. | 118/711 |
| 5,769,950 A | 6/1998 | Takasu et al. | 118/715 |
| 5,811,762 A * | 9/1998 | Tseng | 219/385 |
| 5,855,680 A | 1/1999 | Soininen et al. | 118/719 |
| 5,879,415 A | 3/1999 | Shimada | 29/25.01 |
| 5,879,459 A * | 3/1999 | Gadgil et al. | 118/715 |
| 5,885,353 A | 3/1999 | Strodtbeck et al. | |
| 5,891,251 A | 4/1999 | MacLeish et al. | |
| 5,916,365 A | 6/1999 | Sherman | 117/92 |
| 6,015,590 A * | 1/2000 | Suntola et al. | 427/255.23 |
| 6,042,652 A | 3/2000 | Hyun et al. | 118/719 |
| 6,054,688 A | 4/2000 | Moschini | |
| 6,120,609 A | 9/2000 | Selyutin et al. | |
| 6,125,859 A | 10/2000 | Kao et al. | |
| 6,167,834 B1 | 1/2001 | Wang et al. | 118/723 E |
| 6,168,837 B1 * | 1/2001 | Akram | 427/576 |
| 6,174,377 B1 | 1/2001 | Doering et al. | |
| 6,306,216 B1 | 10/2001 | Kim et al. | |
| 6,316,098 B1 * | 11/2001 | Yitzchaik et al. | 428/339 |
| 6,350,319 B1 | 2/2002 | Curtis et al. | |
| 6,368,954 B1 * | 4/2002 | Lopatin et al. | 438/627 |
| 2001/0035127 A1 | 11/2001 | Metzner et al. | |
| 2002/0195056 A1 * | 12/2002 | Sandhu et al. | 118/719 |

OTHER PUBLICATIONS

Y. Horiike et al., "Filling of Si Oxide into a Deep Trench Using Digital CVD Method," *Applied Surface Science*, vol. 46, pp. 168–174 (1990).

T. Kaizuka et al., "Conformal Chemical Vapor Deposition TiN (111) Film Formation as an Underlayer of Al for Highly Reliable Interconnects," *Jpn. J. Appl. Phys.*, vol. 33, Part 1, No. 1B, pp. 470–474 (Jan. 1994).

K. Kukli et al., "Atomic Layer Epitaxy Growth of Tantalum Oxide Thin Films from Ta $(OC_2H_{55})$ and $H_2O$," *J. Electrochem. Soc.*, vol. 142, No. 5, pp. 1670–1674 (May 1995).

K. Kukli et al., "Influence of atomic layer deposition parameters on the phase content of $Ta_2O_5$ films," *Journal of Crystal Growth*, vol. 212, pp. 459–468 (2000).

M. Leskelä et al., "Atomic Layer Epitaxy in Deposition of Various Oxide and Nitride Thin Films," *Journal de Physique IV*, vol. 5, pp. C5-937–C5-951 (Jun. 1995).

P. Martenson et al., "Use of Atomic Layer Epitaxy for fabrication of Si/TiN/Cu Structures," *J. Vac. Sci. Technol. B*, vol. 17, No. 5, pp. 2122–2128 (Sep./Oct. 1999).

J. Min et al., "Atomic Layer Deposition of TiN Thin Films by Sequential Introduction of Ti Precursor and $NH_3$," *Mat. Res. Soc. Proc.*, vol. 514, pp. 337–342 (1998).

J. Min et al., Atomic Layer Deposition of TiN Films by Alternate Supply of Tetrakis (ethylmethylamino)—Titanium and Ammonia, *Jpn. J. Appl. Phys.*, vol. 37, Part 1, No. 9A, pp. 4999–5004 (Sep. 1998).

L. Niinistö et al., "Synthesis of Oxide Thin Films and Overlayers by Atomic Layer Epitaxy for Advanced Applications," *Materials Science and Engineering*, vol. B41, pp. 23–29 (1996).

M. Putkonen, "Surface–controlled growth of magnesium oxide thin films by atomic layer epitaxy," *Journal of Materials Chemistry*, vol. 9, pp. 2449–2452 (1999).

J. Rautanen et al., "The effect of growth parameters on the deposition of CaS thin films by atomic layer epitaxy," *Applied Surface Science*, vols. 82/83, pp. 553–558 (1994).

M. Ritala et al., "Atomic Layer Epitaxy Growth of TiN Thin Films from $TiI_4$ and $NH_3$," *J. Electrochem. Soc.*, vol. 145, No. 8, pp. 2914–2920 (Aug. 1998).

M. Ritala et al., "Perfectly Conformal TiN and $Al_2O_3$ Films Deposited by Atomic Layer Deposition," *Chemical Vapor Deposition*, vol. 5, No. 1, pp. 7–9 (1999).

H. Sakaue et al., "Digital Chemical Vapor Deposition of $SiO_2$ Using a Repetitive Reaction of Triethylsilane/Hydrogen and Oxidation," *Japanese Journal of Applied Physics*, vol. 30, No. 1B, pp. L124–L127 (Jan. 1990).

O. Sneh et al, "Atomic Layer Growth of $SiO_2$ on Si(100) Using $SiCl_4$ and $H_2O$ in a Binary Reaction Sequence," *Surface Science*, vol. 334, pp. 135–152 (1995).

Tuomo Suntola, "Atomic Layer Epitaxy," *Handbook of Crystal Growth 3. Thin Films and Epitaxy. Part B: Growth Mechanisms and Dynamics*, pp. 601–663, D. T. J. Hurle, Ed., Elsevier (1994).

T. Suntola, "Atomic Layer Epitaxy," *Materials Science Reports 4*, pp. 261–312 (1989).

T. Suntola, "Atomic Layer Epitaxy," *Thin Solid Films*, vol. 216, pp. 84–89 (1992).

H. Viirola et al., "Controlled growth of tin dioxide thin film by atomic layer epitaxy," *Thin Solid Films*, vol. 249, pp. 144–149 (1994).

M. Wise et al., "Diethyldiethoxysilane as a New Precursor for $SiO_2$ Growth on Silicon," *Mat. Res. Soc. Symp. Proc.*, vol. 334, pp. 37–43 (1994).

\* cited by examiner

US 6,939,579 B2

ALD REACTOR AND METHOD WITH CONTROLLED WALL TEMPERATURE

This application is related to U.S. application Ser. Nos. 09/769,562 filed Jan. 25, 2001, now U.S. Pat. No. 6,579,374, and 09/568,077 filed May 10, 2000, now U.S. Pat. No. 6,562,140.

FIELD OF THE INVENTION

This invention relates to the field of reactor design for atomic layer deposition of thin films onto substrates such as wafers and flat panel displays.

BACKGROUND OF THE INVENTION

In atomic layer deposition (ALD), a substrate placed in a reaction space is subjected to alternating pulses of at least two different reactants suitable for producing a desired thin film on the substrate. When the substrate is exposed to a pulse of the first reactant, a monolayer of the first reactant is chemisorbed on the surface of the substrate until all of the available surface sites are occupied with an adsorbed portion of a reactant molecule and saturation occurs. The surface sites may be occupied by the whole of or by a fragment of a vapor-phase reactant molecule, such as when a metal chloride molecule chemisorbs on a surface site that has a hydroxyl group. For example, $TaCl_5$ may chemisorb as a $TaCl_4$ fragment, with HCl released as a gaseous byproduct. The reaction is chemically self-limiting because gaseous first reactant will not adsorb or react with the portion of the first reactant that has already been adsorbed on the substrate surface. The excess of the reactant is then removed by purging the reaction space with an inert gas and/or evacuating the reaction space.

Subsequently, the substrate is exposed to a pulse of the second reactant, which chemically reacts with the adsorbed portion of the first reactant molecules until the reaction is complete and the surface is covered with a monolayer of the chemisorbed portion of the second reactant. Fragments of the second reactant will be adsorbed under some reaction conditions. For example, when water is used as the second reactant it may leave a fragment of $H_2O$, such as hydroxyl groups (—OH) on the surface. Similarly, when ammonia ($NH_3$) is used as the second reactant it may leave fragments such as NH or $NH_2$ groups on the surface. Reaction conditions such as temperature and pressure are chosen to ensure that physisorption of more than one monolayer of the first or second reactant (or portions thereof) on the substrate cannot occur. In this way the growth of the film proceeds atomic layer by atomic layer.

In the art of atomic layer deposition, the temperature of the substrate is not considered to be very critical because the growth rate of the film is not dependent on the temperature of the substrate but rather on the sequential exposure to the different reactant pulses. In fact, relative temperature independence of the process is a primary advantage of ALD, leading to perfect step-wise coverage despite temperature non-uniformities across large substrates. The temperature is preferably high enough to prevent condensation of the reactants on the substrate and to allow the reaction to proceed at a sufficiently high rate. On the other hand, the substrate temperature preferably remains below the limit where thermal decomposition of the individual reactants occurs. For many combinations of reactants, such as metal halides and water, the reaction is able to proceed at temperatures as low as room temperature and as high as the thermal decomposition temperature limit for the reactants. Thus, a wide temperature window for atomic layer deposition is available.

Accordingly, the temperature of the wall of the reactor is not considered to be an important parameter for ALD. Both hot wall and cold wall designs have been used. In reactors with automated substrate transfer, cold wall designs are typically used. A cold wall reactor design is described in U.S. Pat. No. 5,879,465 to Genus Inc. The reactor described comprises a heater, adapted for heating a substrate supported on a support pedestal, and cooling lines for passing coolant through a portion of the body. This design results in a lower region of the reactor that is hot and an upper region of the reactor that is cool.

In conventional chemical vapor deposition (CVD), a cold-wall design is an advantage. In such a design, where only the substrate, placed on a substrate support, is heated, deposition on the cold wall is prevented. This reduces the required cleaning frequency of the system. However, in contrast, cold regions in the wall of an ALD reactor are particularly harmful for the process for a variety of reasons. First of all, increased adsorption or even condensation of the reactants on the cold region of the wall can occur. Physisorbed or condensed material sticks well to a wall at low temperature and thus may not be effectively removed from the reaction space during the purge between the two reactant pulses. This can result in extra consumption of material and accelerated contamination of the reactor wall. Again, this is contrary to conventional CVD where a reduced wall temperature results in reduced contamination of the wall. Furthermore, when the reaction space above the substrate is on the average at a much lower temperature than the substrate itself, more gas is required for purging the reaction space between the reactant pulses because of the increased gas density at low temperature.

Hot wall batch reactors for ALD are known in the art and they avoid the above-noted disadvantages of cold wall ALD reactors. However, heating of the substrates in hot wall batch reactors occurs indirectly and proceeds very slowly at the relatively moderate temperatures used for ALD. Additionally, the loading of substrates in these hot-wall batch reactors is difficult to automate, making them less suitable for production purposes.

It is an object of the present invention to provide a reactor for ALD, comprising automated substrate transfer into and out of the reactor, that avoids the above described disadvantages and provides an improved control of the ALD process. It is a further object of the invention to provide a method for atomic layer deposition in which harmful reactions on the reaction chamber walls are prevented. It is another object of the invention to provide a method for atomic layer deposition that provides a lower deposition rate on the walls of the reaction chamber than on the substrate, while avoiding harmful reactions on the walls that disturb ALD growth on the substrate.

SUMMARY OF THE INVENTION

In accordance with one aspect of the invention, an atomic layer deposition reactor, comprising a heater, temperature sensor and a temperature controller to heat the substrate and control the substrate temperature, is provided with an additional heater, temperature sensor and temperature controller to heat the walls of the reaction chamber and control the temperature of the reaction chamber walls independently from the temperature of the substrate.

In accordance with another aspect of the invention, a method is provided for atomic layer deposition of a film onto a substrate in a reaction chamber. The method includes controlling the temperature of the substrate and additionally controlling the temperature of the walls of the reaction chamber at a level close enough to the substrate temperature to prevent harmful, non-ALD reactions at the reaction chamber walls. Furthermore, the temperature of the walls can be controlled at a level higher or lower than the substrate temperature. The difference between the substrate temperature and the wall temperature is preferably selected, depending upon the chemistry of the process, to result in a deposition rate on the walls that is lower than on the substrate, while avoiding harmful reactions on the walls.

DETAILED DESCRIPTION OF THE PREFERRED EMBODIMENTS

Figure 1:
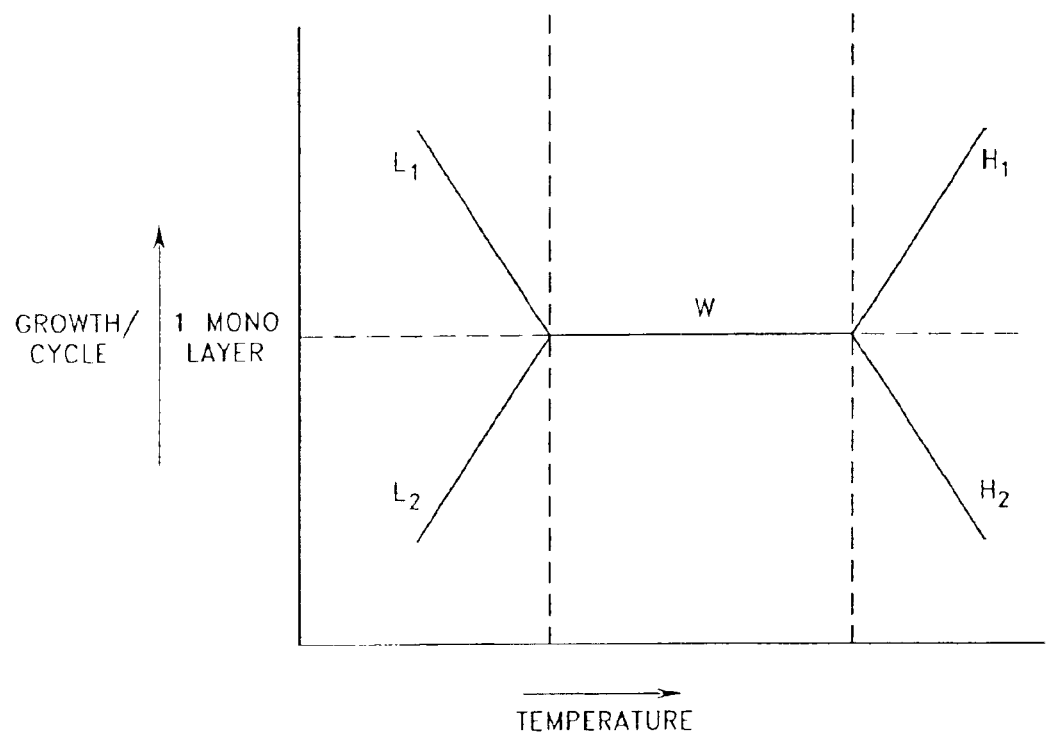
FIG. 1 is a theoretical graph showing different possible reaction regimes for different process recipes in different temperature ranges.

In order to realize atomic layer deposition (ALD), a suitable combination of at least two reactants is preferably available. Even when such a suitable combination of two reactants has been selected, true self-limited atomic layer deposition will only occur in a certain temperature window. In FIG. 1, the growth of the film per cycle is given as a function of temperature. In this figure, W denotes the window in which atomic layer deposition occurs. In the ideal case, represented in the drawings, one monolayer of film is deposited per full cycle. However, due to surface reconstruction or steric hindrance by large surface ligands, less than a monolayer per cycle is typically deposited. L1 denotes a region of increased growth per cycle at the low end of the temperature window (W), caused for certain reactants by reactant condensation. L2 denotes a region of decreased growth per cycle at the low end of the processing window for other reactant combinations. The temperature dependence described by L2 is indicative of a process with other combinations of reactants that is activation energy limited, where the reactivity of the reactants becomes too low. It should be noted that, even for chemistries exhibiting a low-temperature curve like L2, increased deposition will eventually occur at even lower temperatures (not shown) where condensation takes place.

H1 indicates a situation at the high end of the temperature window where the growth per cycle increases above one monolayer. This can occur for some process recipes when the temperature is so high that thermal decomposition of one of the reactants occurs or non-volatile reaction by-products are formed. H2 represents a situation at the high end of the temperature window with reduced growth per cycle for other types of reactants. This may be the result of desorption or dissociation of a surface ligand that is needed to activate the surface for the next reactant. It should be noted that, even for chemistries exhibiting a high-temperature curve like H2, increased deposition can eventually occur at even higher temperatures (not shown) when thermal decomposition causes deposition.

As is made clear in FIG. 1, maintaining surface temperature within a certain window, albeit a wide window, is important to achieving the desired growth of a thin film on a substrate by ALD. Conventionally, the information about the growth curve for a particular reaction is typically used to select an appropriate substrate temperature. Thus, a substrate temperature is chosen that falls within the window in which ALD occurs. The preferred embodiments take advantage of the other information available from the growth curves to minimize deposition on the reactor walls and provide an improved ALD method and apparatus.

In the preferred embodiments, the temperature of the reactor walls is controlled independently of the substrate temperature by a separate heating or cooling system. Thus the temperature of the reactor walls can be maintained at one set point and the temperature of the substrate can be maintained at a second set point. Independent control does not mean that there is no communication between the separate heating or cooling systems. Thus while being independently controllable, it is possible in some arrangements to share information concerning temperature values or PID values between a first and second temperature controller. For example, if the operation of the temperature controllers is based on PID values, with a parameter for the present temperature value, the temperature history (integration) and the future temperature (derivation), the ability to share information between the first and second temperature controller can prevent undesired oscillations in temperature resulting from heat transfer from the substrate holder to the walls or vice versa.

In some arrangements, the walls and the substrate are both set to fall within the ALD temperature window, thereby accomplishing ALD reactions on both the substrate and the walls. In this case, the wall temperature and substrate temperature desirably set to within about 100° C. of one another, preferably within about 25° C. of one another and more preferably within about 10° C. of one another. The wall temperature and substrate temperature will generally be set to approximately the same temperature as one another. In such arrangements, at least reactant thermal decomposition, physisorption and condensation upon the walls can be controllably avoided.

In other arrangements, the wall temperature and substrate temperature are arranged to have a difference in temperature that will reduce film growth upon the walls. In such a case, the temperature of the walls will preferably be controlled to differ from that of the substrate by greater than 10° C., in some cases greater than 20° C. or greater than 40° C. Where possible while still minimizing deposits on the walls, however, the temperature difference is minimized, since the temperature of the walls will affect the temperature of the substrate and vice versa.

In one embodiment the temperature of the reaction chamber walls is higher than the temperature of the substrate. In another embodiment the temperature of the substrate is higher than that of the reaction chamber walls. Thus the walls of the reaction chamber are adjusted to a temperature that minimizes deposition (of any nature) on the walls while the substrate is adjusted to a temperature that maximizes deposition by self-limited ALD mechanisms on the substrate, depending upon the chemistry of the process recipe. In other words, the substrate temperature is maintained within the ALD window (W).

The temperature of the reactor walls is preferably controlled by a first temperature regulating system. In one arrangement, the temperature regulating system maintains the reactor walls at a uniform temperature. In other arrangements, the temperature regulating system maintains different parts of the reactors walls at different temperatures.

Further, in one embodiment, the first temperature regulating system comprises direct heaters. The heaters may be resistance heaters or any other heaters known in the art. In another embodiment the first temperature regulating system comprises a fluid recirculating system. In the case of the fluid recirculating system, the temperature regulating system may function to heat, remove heat from or actively cool the walls of the reactor.

The temperature of the substrate is preferably controlled by a second temperature regulating system. This is preferably accomplished by heating or cooling the substrate support. The substrate support may be a baseplate or any other substrate support known in the art. In one arrangement the entire substrate support is maintained at a uniform temperature. In other arrangements the second temperature regulating system maintains different areas of the substrate support at different temperatures. Thus it is possible to maintain different parts of the substrate at different temperatures.

Further, in one embodiment the second temperature regulating system comprises heaters. The heaters may be resistive heaters or any heater known in the art. In another embodiment the second temperature regulating system comprises a fluid recirculating system. In the case of the fluid recirculating system, the temperature regulating system may function to heat, remove heat from or actively cool the substrate support or susceptor and thus the substrate itself. The temperature regulating system that controls the temperature of the substrate is preferably controllable independently from the temperature regulating system that controls the temperature of the walls, i.e., capable of being programmed with separate temperature setpoints. While the two temperature regulating systems are independently controllable, in one embodiment some data transfer between the first and second temperature controller is contemplated. For example, temperature values or PID values may be shared between the first and second temperature controller.

In order to minimize deposition on the walls, the temperature of the walls is preferably set at a temperature that prevents condensation or physisorption of the reactants on the walls. This is a requirement that is foreign to conventional chemical vapor deposition where the reactants are simultaneously present in the reaction chamber. In ALD, it is essential that the reactants are sequentially and not simultaneously present in the reaction chamber. Physisorption of one reactant on the wall may disturb the ALD reaction regime, and even when this occurs only on the walls of the reactor it can be very harmful. Condensation of source chemicals on the walls can cause particle formation that can be harmful to the controlled deposition on the substrate. The temperature of the reactor walls is also preferably set below the temperature at which thermal decomposition occurs.

Figure 2:
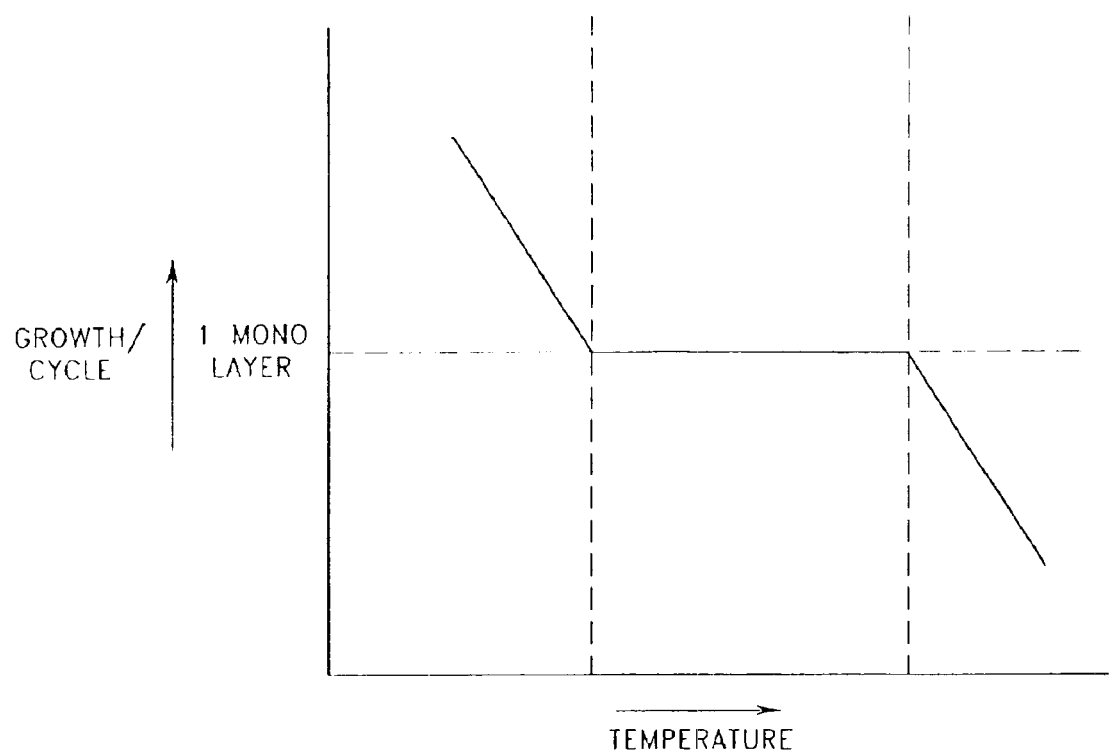
FIGS. 2–4 show different possible growth rate curves as a function of temperature for different specific chemistries.
Figure 3:
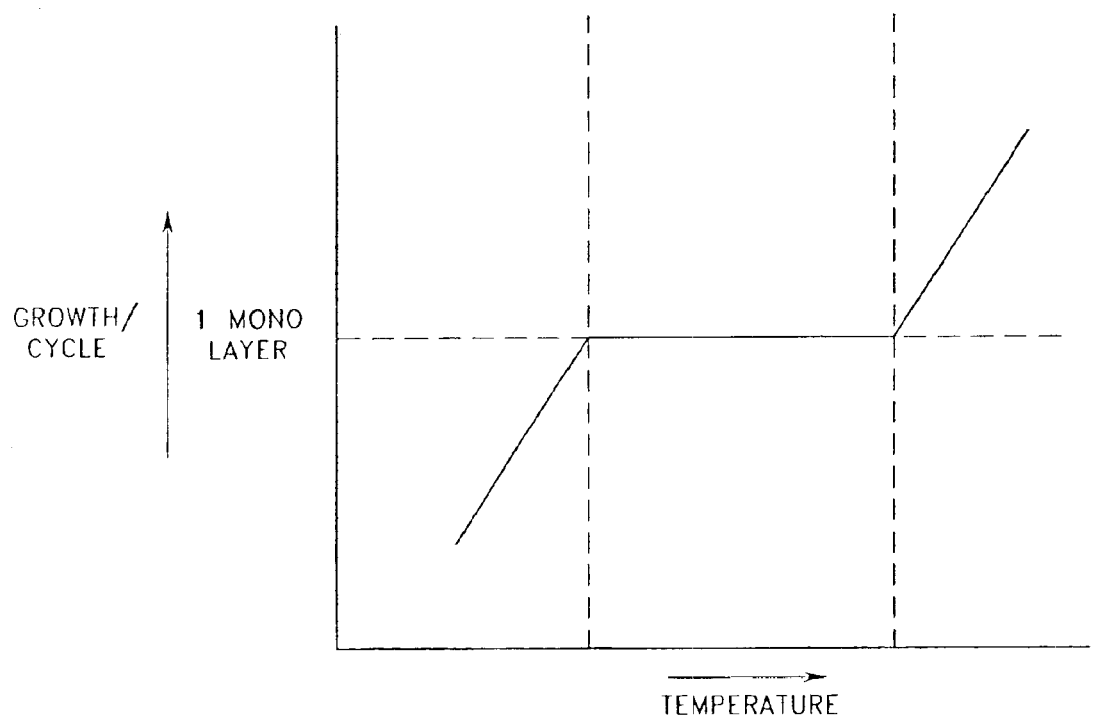
Figure 4:
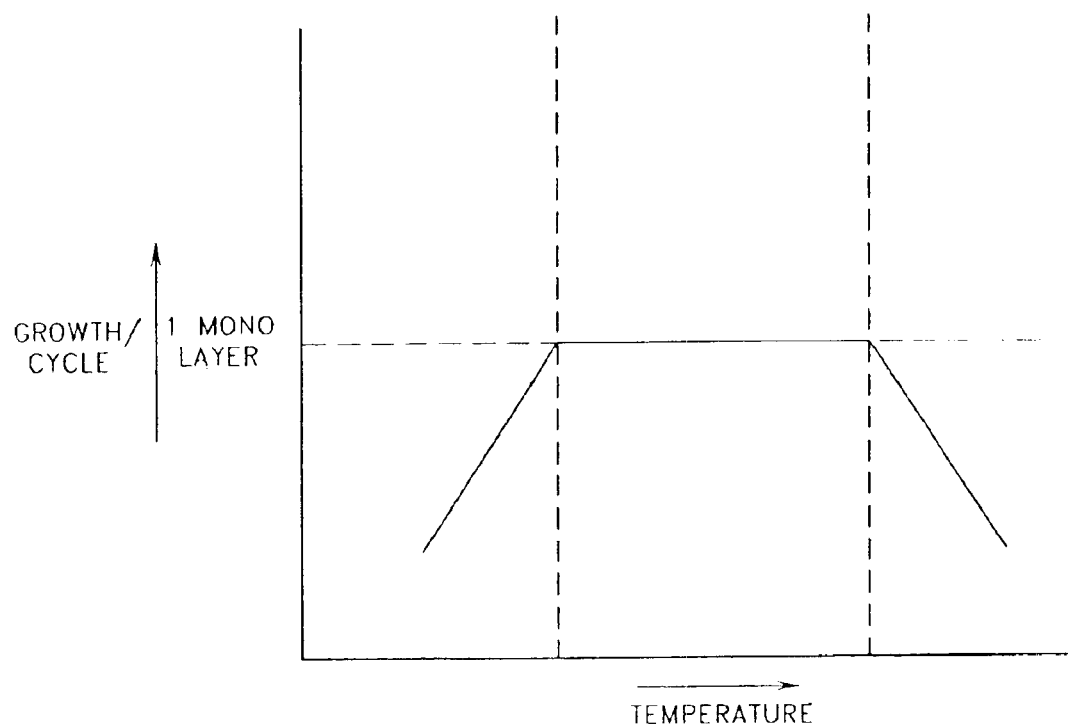

The actual growth rate curve for a particular reaction depends on the combination of reactants selected. In FIGS. 2–4 some basic curves are shown. For example, the growth curve shown in FIG. 2 represents a situation in which growth is reduced at temperatures above the window in which ALD occurs, while growth is increased at temperatures below the window. Thus, in the case of reactants that have a growth curve as shown in FIG. 2, it is preferred to have the temperature of the reactor walls set higher than the window at which ALD occurs. However the temperature of the reactor walls is also preferably set below the temperature (not shown) at which the reactants thermally decompose. This will minimize unwanted deposition on the reactor walls. At the same time, the substrate is preferably heated to a temperature that is within the window for ALD, thus allowing for the desired deposition on the substrate.

FIG. 3 represents a situation in which the properties of the reactants are such that growth is reduced at temperatures below the ALD window, while at temperatures above the window growth is increased. In this situation, it is preferred to have the temperature of the substrate maintained within the window for ALD while the temperature of the reactor walls is set below this. However, the temperature of the reactor walls is preferably maintained above the temperature (not shown) at which condensation occurs, thus minimizing deposition and condensation on the reactor walls and improving the ALD deposition on the substrate.

It is also possible that deposition or growth is reduced at temperatures both above and below the ALD temperature window. This situation is depicted in FIG. 4. In such a situation, the substrate temperature is preferably maintained within the ALD temperature window while the reactor wall temperature is set either higher or lower than this. The reactor wall temperature is also preferably maintained above the temperature (not shown) at which condensation occurs and below the temperature (not shown) at which thermal decomposition occurs, thus minimizing accumulation of reactants and deposition on the reactor walls.

One skilled in the art will be able to identify the type of growth curve that is representative of a particular reaction. Several examples of reactions corresponding to the curves shown in FIGS. 2–4 are described below.

EXAMPLE 1

A growth curve corresponding to FIG. 2 has been obtained for the growth of ZnSe from alternating pulses of elemental Zn and Se. A growth of about 1 monolayer per cycle occurs in the temperature range of 250° C. to 350° C. (Suntola, T. 1994. "Atomic Layer Epitaxy," in Handbook of Crystal Growth 3, Thin Films and Epitaxy, Part B: Growth Mechanisms and Dynamics, D. T. J. Hurle, Ed. Elsevier, Chapter 14, pp. 601–663). Thus, the temperature of the substrate is preferably set between 250° C. and 350° C. while the temperature of the reactor walls are preferably set above 350° C. (resulting in reduced growth on the walls). In general, the reactor walls are also set below the temperature at which the reactants thermally decompose. It is to be noted, however, that in this example the source chemicals are elements and in that respect they cannot thermally decompose, although $Se_8$ molecules may fragment into smaller selenium molecules.

EXAMPLE 2

A growth curve according to FIG. 3 has been reported for the atomic layer deposition of GaAs from alternating pulses of trimethylgallium and arsine. A growth of about 1 monolayer occurs in the temperature range of 490° C. to 520° C. (Suntola, T. "Atomic Layer Epitaxy," in Handbook of Crystal Growth 3, Thin Films and Epitaxy, Part B: Growth Mechanisms and Dynamics, D. T. J. Hurle, Ed. Elsevier, Chapter 14, pp. 601–663 (1994)).

In this situation, the substrate temperature is preferably set between 490° C. and 520° C. and the temperature of the reactor walls is preferably set below 490° C. (resulting in reduced growth on the walls). However, the temperature of the reactor walls is also preferably maintained above the temperature at which condensation of the reactants would occur.

EXAMPLE 3

A growth curve according to FIG. 4 has been reported for the ALD growth of $SnO_2$ from alternating pulses of vaporized $SnCl_4$ and $H_2O$ (Viirola and Niinistö, Thin Solid Films, 249:144–149 (1994)). The ALD growth rate was maximal at a substrate temperature of about 500° C. When the substrate temperature was decreased from 500° C. to 300° C., the growth rate of $SnO_2$ dropped from 0.30 Å/cycle to about 0.12 Å/cycle.

In this case, where the ALD reaction is considered thermally driven, in the sense that ALD reactions are facilitated at higher temperatures and inhibited at lower temperatures, it is preferable to set the wall temperature at a lower level than the substrate temperature. The reaction chamber wall temperature is also preferably high enough to avoid the condensation of source chemicals on the walls, which can produce particles that are harmful for thin film processes. The maximum possible vapor pressure of the source chemical in a chamber depends on the coldest spot in the chamber. For example, at 92° C. the maximum vapor pressure of $SnCl_4$ is 400 Torr while that of water is 567 Torr. The reaction byproduct HCl is a gas at room temperature. Consequently, with a cold spot of 92° C. the maximum possible vapor pressure of the source chemicals in the chamber is much higher than the normal operating pressure of the ALD reaction chamber, where the operating pressure is approximately in the range of 1–50 Torr. Thus, purging the surplus source chemical away from the reaction chamber should be relatively easy.

In one embodiment of the present invention, the vapor pressure of the $SnCl_4$ and $H_2O$ source chemicals and the HCl by-product are taken into account and the reaction chamber wall temperature is preferably set well below the substrate temperature without the problem of condensation of the chemicals on the reaction chamber walls. Removal of surplus source chemicals is preferably carried out by purging with an inert gas or by pumping.

It is also important to take into account the adsorption of water. Water adsorbs easily on surfaces at low temperatures, due to the polarity of the water molecule. At room temperature there can be 10–100 molecular layers of $H_2O$ on surfaces, possibly because of hydrogen bonds between the water molecules. The removal of physisorbed water is preferably completed before any other source chemicals are introduced into the reaction chamber. The failure to remove physisorbed source chemicals from the reaction chamber walls may result in rapid uncontrolled growth of solid material on the walls and formation of solid particles that contaminate the substrate surface. The reaction chamber wall temperature at which physisorbed water on the walls can effectively be prevented and/or be removed during the purge period that follows the water pulse is desirably greater than about 200° C.

As a result of the reaction conditions described above, in the case of ALD deposition of $SnO_2$ from vaporized $SnCl_4$ and $H_2O$ the substrate temperature is preferably set at about 500° C. while the reactor wall temperature is preferably set between about 200° C. and about 500° C., more preferably about 300° C.

EXAMPLE 4

The deposition rate of MgO from $Mg(thd)_2$ and ozone on silicon and soda lime glass substrates shows a growth rate curve corresponding to FIG. 4. A maximum deposition rate of 0.27 Å/cycle at 225° C.–250° C. was observed. At 170° C. the growth rate was practically zero and at 270° C. the growth rate was about 0.08 Å/cycle (M. Putkonen, L.-S. Johansson, E. Rauhala and L. Niinistö, J. Mater. Chem., Vol. 9, pp. 2249–2252 (1999)).

According to one embodiment of the present invention, the reaction chamber walls are preferably kept cooler than the susceptor or substrate support. In the case of MgO deposition, the temperature of the reaction chamber walls is preferably lowered to less than about 200° C., more preferably between about 170° C. and about 180° C. The substrate is preferably heated to a temperature of between about 200° C. and about 270° C., more preferably between about 225° C. and about 250° C. These temperatures will keep the walls essentially clean while the MgO thin film grows with a good ALD growth rate on the substrate.

According to another embodiment of the present invention the temperature of the reaction chamber walls is increased above that of the substrate. The reaction chamber wall temperature is preferably increased to at least about 270° C., thus decreasing the growth rate of MgO on the walls by about 70%. The substrate is preferably heated to a temperature of between about 200° C. and about 270° C., more preferably between about 225° C. and about 250° C., ensuring that the ALD growth rate of MgO on the substrate will stay at the maximum level of 0.27 Å/cycle.

In both of these embodiments the walls of the reaction chamber will need to be cleaned less frequently than in the case where the reaction chamber walls are kept at the same temperature as the substrate. When using $Mg(thd)_2$ the reaction chamber wall temperature is preferably not set below about 170° C. because condensation of $Mg(thd)_2$ on the walls could occur. On the other hand, the maximum reaction chamber wall temperature is preferably not so high that the source chemical, in this example $Mg(thd)_2$, thermally decomposes on the reaction chamber walls. The upper limit for $Mg(thd)_2$ is at about 400° C.–450° C. In summary, while the substrate is preferably heated to a temperature of between about 225° C. and about 250° C., the walls are preferably heated to 170° C.–200° C. or 270° C.–400° C.

EXAMPLE 5

The deposition rate of CaS by ALD was shown to be strongly dependent on the temperature when $Ca(thd)_2$ and $H_2S$ were used as source chemicals (J. Rautanen, M. Leskelä, L. Niinistö, E. Nykanen, P. Soininen, M. Uttriainen, Applied Surface Science, 82/83:553–558 (1994)). The deposition rate of CaS on the substrate surface changed from 0.12 Å/cycle at 200° C. to a maximum value of 0.52 Å/cycle at 350° C., possibly because the available activation energy affected the reactions. According to one embodiment of the present invention, the substrate is preferably maintained at a temperature of 350° C. while the walls are preferably maintained at a lower temperature to reduce the deposition rate on the walls. However, the reaction chamber walls are preferably kept at a temperature above 190° C. when $Ca(thd)_2$ is used as a source chemical, because a suitable source temperature of Ca(thd)$_2$ is 190° C. and condensation of Ca(thd)$_2$ on the reaction chamber walls is possible below this temperature. More preferably the reaction chamber wall temperature is maintained between about 200° C. and about 290° C. to minimize the accumulation of solid material on the reaction chamber walls.

This process also follows the curve of FIG. 4. Thus, in another embodiment the walls are preferably maintained at a temperature higher than the substrate, thus reducing deposition on the walls. However, the reaction chamber walls are preferably kept below 450° C., because thermal decomposition of Ca(thd)$_2$ appears to occur at temperatures of 450° C. and above.

EXAMPLE 6

ALD processes may use metal halides and ammonia as source chemicals for the deposition of metal nitride thin films, particularly in fabricating integrated circuits. By-products include hydrogen halides. The hydrogen halides may form ammonium halides that desorb quite slowly from surfaces. Enhanced desorption of ammonium halides from the reaction chamber walls is achieved in another embodiment of the present invention. Although the substrate temperature is preferably kept at 400° C. or lower because of heat-sensitive layers or components on the substrate, the reaction chamber walls are preferably heated to temperatures above 400° C. to enhance the desorption of adsorbed reaction byproducts from the reaction chamber walls. In this embodiment it may be necessary to remove heat from the substrate so that heat from the walls does not cause the substrate to exceed any temperature limit imposed by substrate materials, e.g., 400° C. for high-k materials that will be used in integrated circuits. Thermal energy is preferably actively removed from the substrate by the use of the fluid recirculating system, as described with respect to FIGS. 7 and 8. The fluid recirculating system preferably comprises a heat removal medium that is circulating through channels within the susceptor that is holding the substrate.

EXAMPLE 7

Another exemplary ALD recipe to which the principles and advantages described herein can be applied is the deposition of tantalum pentoxide (Ta$_2$O$_5$) from TaCl$_5$ and H$_2$O. Usually the deposition temperature of Ta$_2$O$_5$ is limited to about 300° C. and lower because at higher temperatures the TaCl$_5$ source chemical starts to etch deposited Ta$_2$O$_5$ away and form volatile TaOCl$_3$. This type of etching is described in K. Kukli, M. Ritala, R. Matero, M. Leskelä, "Influence of atomic layer deposition parameters on the phase content of Ta2O$_5$ films," Journal of Crystal Growth, 212:459–468 (2000). According to one embodiment of the present invention, the deposition of Ta$_2$O$_5$ from tantalum halide and water is prevented on the reaction chamber walls by keeping the wall temperature above 300° C. while the substrate temperature is kept below 300° C. Ta$_2$O$_5$ grows by ALD on the substrate surface but the reaction chamber walls stay essentially clean. As described with respect to Example 5, depending up on the reactor configuration, it may be advisable to provide plumbing capable of removing heat from the substrate support, such as illustrate in FIGS. 7 and 8, to maintain the substrate temperature below 300° C.

These examples further demonstrate that temperature control can be important to the ALD process. Controlling the temperature of the substrate within certain limits is a prerequisite to achieving a desired result. However, as disclosed herein, the temperature of the walls of the reaction chamber is also controlled to prevent harmful phenomena like condensation or decomposition from occurring on the walls. In the simplest embodiment, the wall temperature is set at the same temperature as the substrate so that on both substrate surface and the reaction chamber wall an atomic layer deposition growth regime is realized, which will at least avoid condensation and thermal decomposition. However, in the situation of a growth curve as in FIG. 2 the wall temperature is preferably set at a higher value than the substrate temperature to prevent deposition on the wall. At the same time, the wall temperature preferably remains below the value where thermal decomposition of a reactant can occur. On the other hand, in the case of a growth curve as in FIG. 3 it is preferable to control the wall temperature at a lower value than the temperature of the substrate for the same reason of preventing or reducing the deposition onto the wall. In this case the temperature is preferably not so low that condensation of a reactant on the wall occurs. Finally, in the case of a growth curve as in FIG. 4, the wall temperature can be selected to be higher than the substrate temperature but lower than the thermal decomposition limit, while in other arrangements the wall temperature is set lower than the substrate temperature but higher than the condensation limit.

In the art, an apparatus for atomic layer deposition comprises a first heater, a first temperature sensor and a first temperature controller to heat the substrate and control the substrate temperature. In the apparatus according to the preferred embodiments, an atomic layer deposition reactor additionally comprises a second temperature regulating system, such as a second heater, a second temperature sensor and a second temperature controller, to heat the walls of the reaction chamber and control the temperature of the walls of the reaction chamber. It will be understood from the descriptions of the preferred embodiments below that the temperature regulating systems need not always be heaters, although one of the two temperature regulators will generally be a heater.

Figure 5:
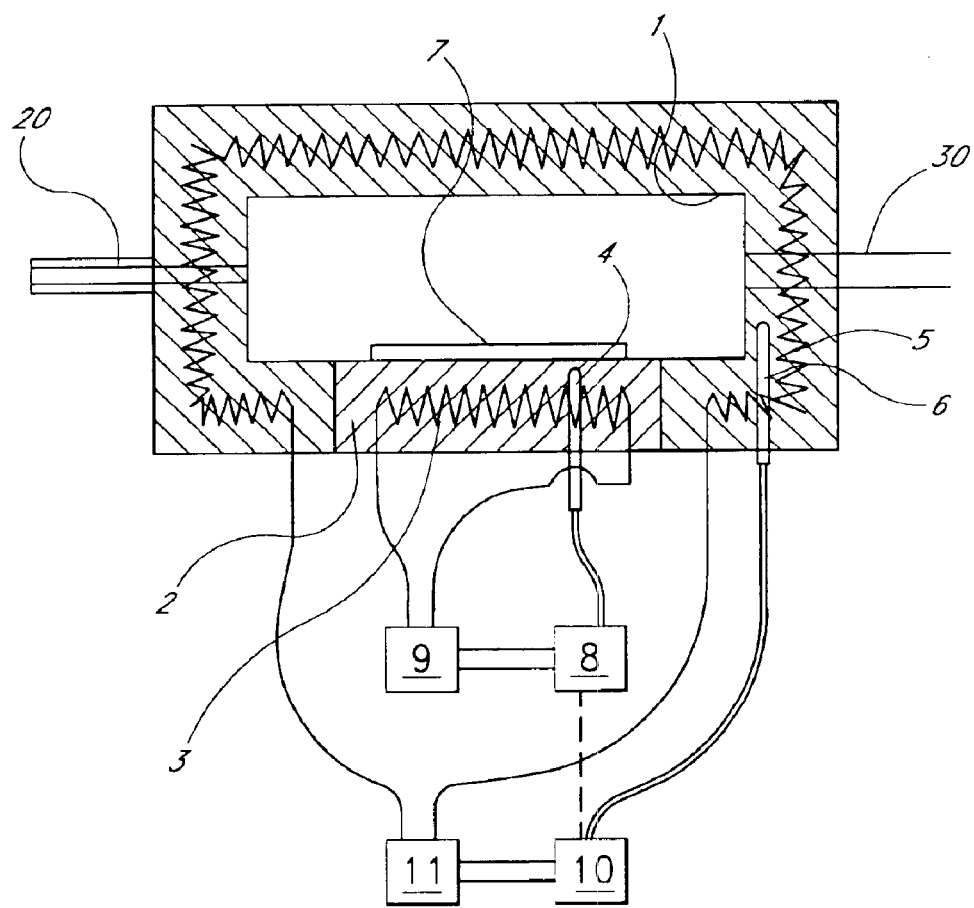
FIG. 5 is a schematic cross section of an atomic layer deposition reactor, constructed according to a first embodiment of the invention.

In a first embodiment, represented in FIG. 5, the first and second temperature control systems comprise resistance heaters. In FIG. 5, reference numeral 1 indicates reaction chamber walls. A substrate support structure 2 supports a substrate 7. Advantageously, the support structure 2 is movable relative to the walls 1, facilitating loading and unloading substrates in an automated fashion. For example, the support structure can comprise a base plate configured to lower for access by a wafer handling robot, and to rise into sealing contact with the chamber walls 1.

The substrate support structure 2 is provided with a first heater 3 and a first temperature sensor 4 to sense the temperature of the substrate support structure 2. The first temperature sensor 4 is connected to a first temperature controller 8, which provides an input signal to a first power supply 9 to control the power applied to the first heater 3, which is also connected to the first power supply 9. A second heater 5 heats the reaction chamber walls 1 and the temperature of the walls 1 is sensed by a second temperature sensor 6, which is connected to a second temperature controller 10. The second temperature controller 10 provides an input signal for a second power supply 11, connected to the second heater 5, to control the power applied to the second heater 5. The dashed line between the first temperature controller 8 and the second temperature controller 10 represents a possible data transfer line. The data transfer line may be used to share temperature and PID information between the controllers, thus preventing oscillation of the temperature of the substrate support 2 and reaction chamber walls 1.

It will be understood by the skilled artisan that a plurality of temperature sensors can be connected to each controller and that control can be split into zones, particularly within the walls. In addition, a plurality of heaters can be controlled by each controller and each zone may hold a separate heater. Thus, the temperature sensors can each provide an input to the temperature controller and different parts of the walls can be maintained at different temperatures. Similarly, in another embodiment more than one temperature sensor and more than one heater are present in the substrate support, allowing for different parts of the substrate to be maintained at different temperatures. In this case power can be applied to a plurality of heaters and it is possible to adjust the power level for each heater. An analogous system for zoned control of substrate temperature (for a radiantly heated substrate) is disclosed, for example, in U.S. Pat. No. 4,836,138 to Robinson et al., issued Jun. 6, 1989.

Additionally, the preferred chamber is located within a separate vacuum vessel. In the preferred embodiments, the vacuum vessel is not exposed to reactants, and so temperature control of the vacuum vessel walls is not critical. In some arrangements, however, parts of the vacuum vessel walls can be exposed to the vapor phase reactants during processing. In such arrangements, those exposed parts of the vacuum vessel walls effectively form part of the reaction chamber walls, and are preferably also maintained at a temperature that minimizes deposition. Where not all of the chamber walls are exposed to reactants, on the other hand, unexposed portions of the chamber walls need not have their temperature separately controlled.

One reactant infeed line 20 is shown in schematic FIG. 5. However, for each reactant used in the process a separate reactant infeed line is preferably present. The gases are exhausted through an outlet channel 30, which is connected with a vacuum pump (not shown). Different temperatures for substrate and reaction chamber walls can be achieved because both the walls and the substrate support structure are inflicted with thermal losses to the environment.

The illustrated heaters 3, 5 are embedded within the substrate support 2 and chamber walls 1, respectively. However, the skilled artisan will appreciate that the heaters can also comprise independently controlled heating plates adjacent to the support and adjacent to the walls. In still other arrangements, two or more heating systems can be radiative or inductive, such that they can remotely heat the support and walls, respectively, with independent control.

As an alternative, either the reaction chamber walls, or the substrate support structure, or both, can be provided with channels connected to a fluid recirculating system, as discussed below with respect to the further embodiments of the invention. In such arrangements, the corresponding heater is a fluid heater, heating the fluid in the recirculating system. With fluid heating systems, temperatures up to 400° C. can easily be achieved. A fluid recirculating system provides not only the possibility of heating a substrate support or reactor wall, but also allows the removal of heat from the object through which the fluid is circulating. If in the case of a heat removal requirement the natural heat loss of the recirculating system is not sufficient to maintain a controlled temperature, the recirculating system can be equipped with an active cooling element instead of or in addition to the heater. This is particularly relevant to the case where the substrate temperature is controlled at a lower value than the temperature of the walls and heat is to be removed from the substrate support in order to maintain the desired substrate temperature.

The choice of the circulating fluid depends on the maximum allowed fluid temperature and the intended application, as will be recognized by one skilled in the art. Several possible choices are described below, but any heat transfer fluid known in the art may be used.

Dow Chemical manufactures organic heat transfer fluids that can be used from room temperature up to 400° C. For example, DOWTHERM A™ is a eutectic mixture of diphenyl oxide and biphenyl oxide that has excellent thermal stability at 400° C. As another example, SYLTHERM 800™ is a non-corrosive silicone fluid that can operate more than 10 years at 400° C. without fouling the heating system. The heat capacity of DOWTHERM A™2.7 J/g° C. and that of SYLTHERM 800™ is 2.2 J/g° C.

Liquid metals are another class of heat transfer materials that could be used as circulation fluid in the apparatus of the present invention. Mercury (Hg) and some eutectic alloys of alkali metals (Na, K, Rb, Cs) are liquids at room temperature. However, they either have high toxicity (Hg) or very high reactivity (Na, K, Rb, Cs). In contrast, gallium metal has low reactivity and it is not toxic. Pure gallium metal melts at 30° C. and has a very low vapor pressure (1 Torr at 1349° C.). Eutectic alloys of gallium and e.g., tin or indium, are liquids at room temperature and thus any clogging of the fluid circulation tubes is avoided when the reactor is cooled to room temperature. The heat capacity of Ga is 0.37 J/g·° C. If the reaction chamber is made of titanium metal (heat capacity 0.52 J/g·° C.), cooling 1 g of titanium by 1° C. heats 1.4 g of Ga by 1° C. Liquid metal may be circulated with, e.g., an electromagnetic pump that has no moving parts.

As an alternative, gaseous fluids can be applied. Although the volumetric heat capacity of gases is less than that of fluids, in many practical cases where the heat transport requirement is not excessively high, the use of gaseous fluids is practical. The table below provides the heat capacity, density and volumetric heat capacity for several gaseous fluids.

| Gas | heat capacity (J/g · ° C.) | density (g/dm$^3$) | volumetric heat capacity (J/dm$^3$ · ° C.) |
| --- | --- | --- | --- |
| He | 5.19 | 0.1785 | 0.93 |
| N$_2$ | 1.04 | 1.25 | 1.3 |
| Ar | 0.124 | 1.784 | 0.22 |

Based on these values, cooling 1 g of titanium by 1° C. would heat 0.4 liters of nitrogen or 0.6 liters of helium by 1° C. when the gas pressure is 1 atm. Maximum allowed gas pressure depends on the design of the gas circulation system.

Figure 6:
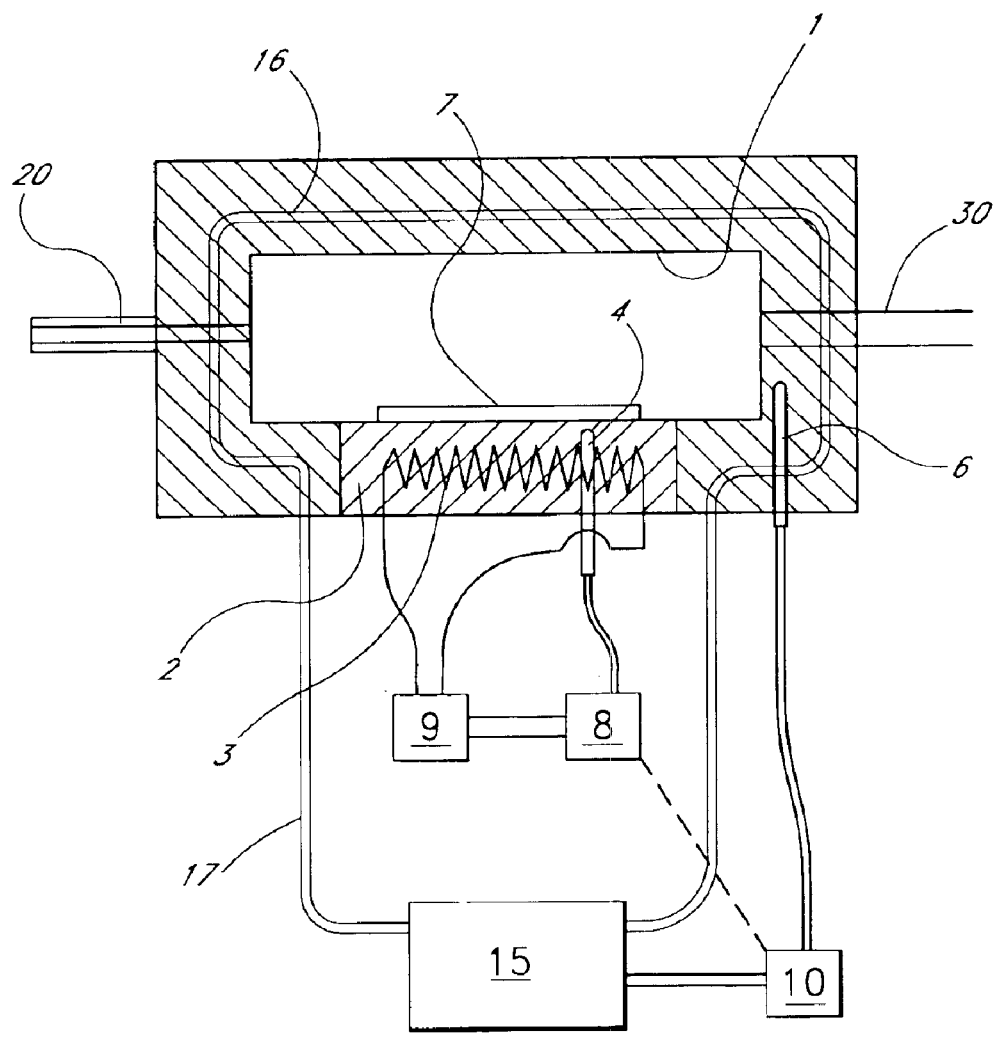
FIG. 6 is a schematic cross section of an atomic layer deposition reactor, constructed according to a second embodiment of the invention, wherein the walls are provided with a fluid recirculating system.

FIG. 6 shows an embodiment in which the reactor walls 1 are provided with a fluid recirculating system. Fluid circulation channels 16 are formed within the walls 1, and are connected to a fluid recirculating pump and a wall temperature regulator 15 via connection lines 17. The second temperature controller 10 provides an input signal to the fluid recirculating pump and the wall temperature regulator 15 to control the power applied to the fluid, such that the temperature of the walls 1 remains constant. The wall temperature regulator 15 may also include a refrigerator unit (not shown) for cooling the recirculating fluid. The temperature of the walls 1 is sensed by the second temperature sensor 6, which is connected to the second temperature controller 10. As in FIG. 5, the dashed line between the first temperature controller 8 and the second temperature controller 10 represents a possible data transfer line.

Figure 7:
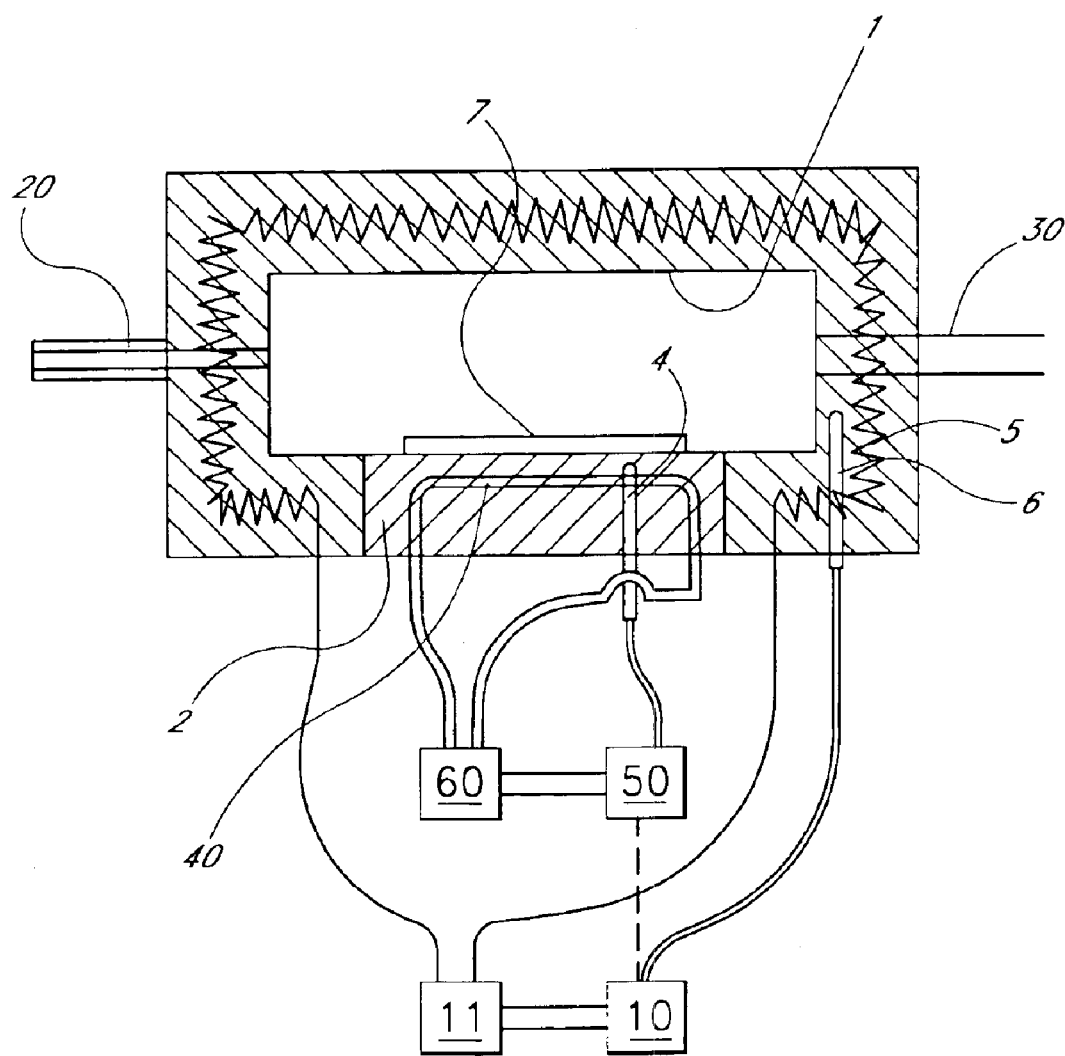
FIG. 7 is a schematic cross section of an atomic layer deposition reactor, constructed according to a third embodiment of the invention, wherein the substrate support is provided with a fluid recirculating system.
Figure 8:
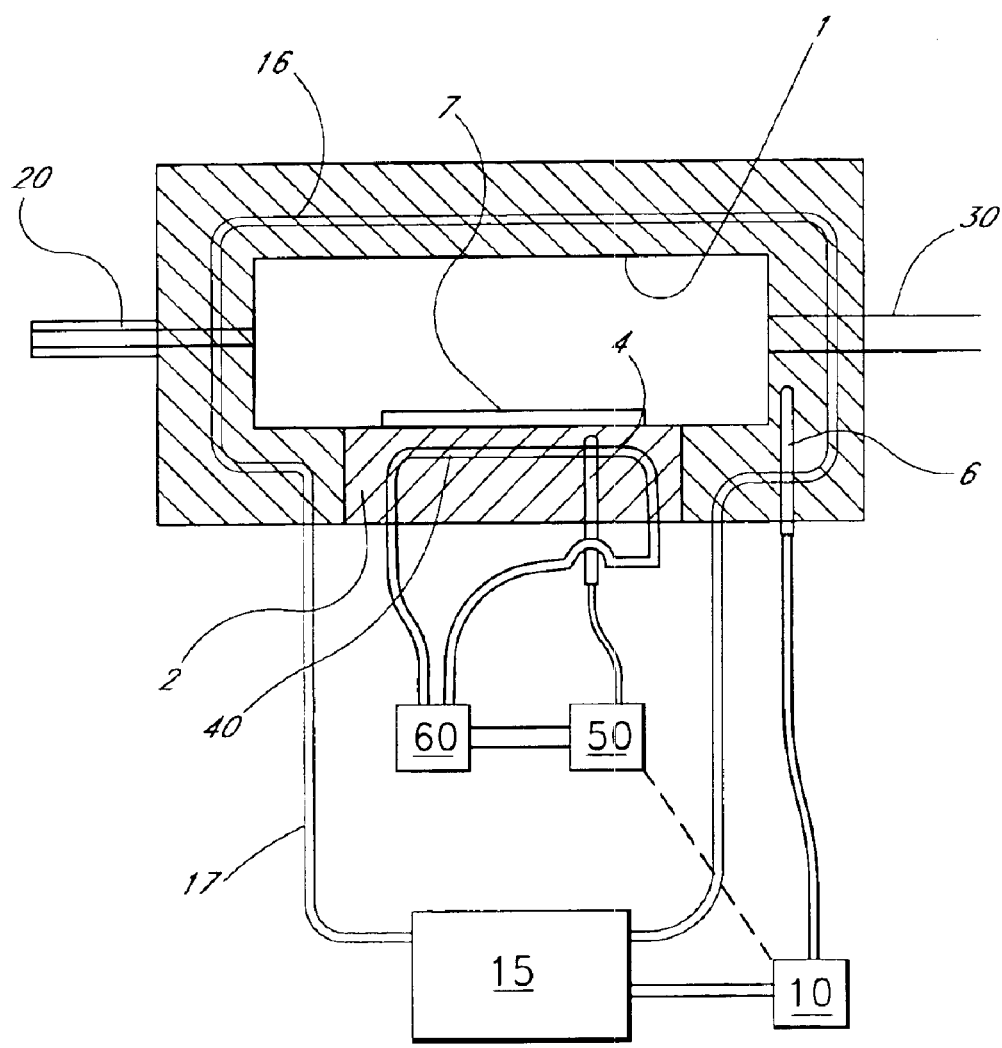
FIG. 8 is a schematic cross section of an atomic layer deposition reactor, constructed according to a fourth embodiment of the invention, wherein both the walls and the substrate support are provided with fluid recirculating systems.

In FIG. 7 the substrate support 2 is provided with a fluid recirculating system. The system includes fluid recirculating channels 40 through the substrate support, connected to a fluid recirculating pump and a first temperature regulator 60. The temperature of the fluid, and thus of the substrate support 2 and substrate 7, is maintained by input from the first temperature controller 50 to the fluid recirculating pump and first temperature regulator 60. The first temperature regulator 60 may also include a refrigerator unit (not shown) for cooling the recirculating fluid. The walls 1 have their temperature controlled by a system as described with respect to FIG. 5. In FIG. 8, the walls 1 and the substrate support 2 are provided with independently controlled fluid recirculating systems. The ALD reactor is thus shown with the system of FIG. 6 for the wall 1 temperature control, and the system of FIG. 7 for substrate support 2 temperature control. In both FIGS. 7 and 8, the dashed line between the first temperature controller 50 and the second temperature controller 10 represents a possible data transfer line.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A method for growing a thin film on a substrate by exposing the substrate in a reaction chamber defined by a plurality of walls to alternate surface reactions of vapor-phase reactants, comprising:
   controlling a chamber wall temperature of at least those portions of the chamber walls that are exposed to the vapor-phase reactants;
   loading the substrate onto a substrate support structure inside the reaction chamber;
   controlling a substrate support temperature independently of the chamber wall temperature; and
   alternately and sequentially feeding at least two vapor phase reactants into the reaction chamber
   wherein the substrate support temperature is maintained at a first temperature and the chamber wall temperature is maintained at a second temperature different from the substrate support temperature and, wherein the first temperature and the second temperature are within an atomic layer deposition (ALD) temperature window such that there is atomic layer deposition (ALD) growth on the substrate and the chamber wall and the difference between the first temperature and the second temperature is selected to maintain a lower rate of atomic layer deposition (ALD) film growth upon the chamber walls as compared to the substrate.

2. The method of claim 1, wherein the chamber wall temperature is maintained higher than the substrate support temperature.

3. The method of claim 2, wherein the chamber wall temperature is controlled at a level low enough to prevent thermal decomposition of the reactants.

4. The method of claim 1, wherein the chamber wall temperature is maintained lower than the substrate support temperature.

5. The method of claim 4, wherein the chamber wall temperature is controlled at a level high enough to prevent condensation of one of the reactants on the wall.

6. The method of claim 4, wherein the chamber wall temperature is controlled at a level high enough to prevent physisorption of one of the reactants on the wall.

7. The method of claim 4, wherein one of the reactants is water and the wall is maintained at a temperature of 200° C. or higher.

8. The method of claim 1, wherein the chamber wall temperature is maintained higher than a temperature of the reactants as they enter the reaction chamber.

9. A method for growing a thin film on a substrate by exposing the substrate in a reaction chamber defined by a plurality of chamber walls to alternate surface reactions of vapor-phase reactants, comprising:
   loading the substrate onto a substrate support structure inside the reaction chamber;
   maintaining the substrate support at a first temperature within a first ALD temperature window by means of a first temperature controller;
   maintaining at least portions of the chamber walls that are exposed to the vapor-phase reactants at a second temperature different from the first temperature by means of a second temperature controller, the second temperature being within a second ALD temperature window that encompasses the first ALD temperature window; and
   alternately and sequentially feeding at least two vapor phase reactants into the reaction chamber;
   wherein the second temperature is selected to lower a rate of atomic layer deposition (ALD) film growth upon the walls relative to the substrate; and
   growing ALD film on the chamber walls at a lower rate as compared to the substrate.

10. The method of claim 9, wherein the second temperature is maintained higher than the first temperature.

11. The method of claim 10, wherein maintaining the first temperature comprises removing heat from the substrate support.

12. The method of claim 11, wherein removing heat comprises circulating a fluid through the substrate support.

13. The method of claim 9, wherein the second temperature is maintained lower than the first temperature.

14. A method for preventing unwanted deposition on walls of an atomic layer deposition reaction chamber, comprising alternately and sequentially feeding at least two vapor phase reactants into the reaction chamber such that there is ALD growth on the substrate and the chamber walls while controlling a temperature of the substrate and independently controlling a temperature of at least those portions of the chamber walls exposed to the reactants, such that both the temperature of the substrate and the temperature of the walls are within an ALD temperature window and a rate of deposition by self-limited atomic layer deposition on the substrate is maximized while self-limited atomic layer deposition (ALD) film growth on the walls is reduced relative to controlling a temperature of the substrate alone.

15. The method of claim 14, wherein controlling the chamber wall temperature comprises heating the chamber walls.

16. The method of claim 14, wherein controlling the substrate temperature comprises heating the substrate.

17. The method of claim 14, wherein controlling the wall temperature comprises maintaining the wall temperature in a range to avoid condensation and physisorption of reactants upon the walls.

18. The method of claim 17, wherein controlling the wall temperature comprises maintaining the wall temperature in a range to avoid thermal decomposition of reactants upon the walls.

19. The method of claim 18, wherein controlling the wall temperature comprises maintaining the wall temperature in a range to reduce film growth rates upon the walls relative to deposition rates upon the substrate.

20. A method for growing a thin film on a substrate by exposing the substrate in a reaction chamber defined by a plurality of walls to alternate surface reactions of vapor-phase reactants, comprising:

- controlling a chamber wall temperature of at least those portions of the chamber walls that are exposed to the vapor-phase reactants;
- loading the substrate onto a substrate support structure inside the reaction chamber;
- controlling a temperature of the substrate independently of the chamber wall temperature;
- alternately and sequentially feeding at least two vapor phase reactants into the reaction chamber; and
- maintaining the temperature of the substrate within a first ALD temperature window such that approximately one monolayer is deposited per full cycle and maintaining the chamber wall temperature within a second ALD temperature window that is either (i) above a lower temperature limit at which condensation takes place on the chamber walls and below the first ALD temperature window or (ii) below a high temperature limit at which thermal decomposition causes deposition on the chamber walls and above the first ALD temperature window.

* * * * *